United States Patent
Jung

(10) Patent No.: US 7,538,378 B2
(45) Date of Patent: May 26, 2009

(54) FLASH MEMORY DEVICE AND PROGRAMMING AND ERASING METHODS THEREWITH

(75) Inventor: Jin Hyo Jung, Kyunggido (KR)

(73) Assignee: Dongbu HiTek Co., Ltd., Seoul (KR)

( * ) Notice: Subject to any disclaimer, the term of this patent is extended or adjusted under 35 U.S.C. 154(b) by 771 days.

(21) Appl. No.: 11/022,889

(22) Filed: Dec. 28, 2004

(65) Prior Publication Data
US 2005/0141281 A1 Jun. 30, 2005

(30) Foreign Application Priority Data
Dec. 31, 2003 (KR) .................. 10-2003-0101387
Dec. 31, 2003 (KR) .................. 10-2003-0101389

(51) Int. Cl.
*H01L 29/94* (2006.01)
(52) U.S. Cl. .................. 257/316; 257/320
(58) Field of Classification Search .......... 257/316, 257/320
See application file for complete search history.

(56) References Cited

U.S. PATENT DOCUMENTS 6,737,320 B2 * 5/2004 Chen et al. .................. 438/257

* cited by examiner

*Primary Examiner*—Douglas M Menz
(74) *Attorney, Agent, or Firm*—Sherr & Vaughn, PLLC

(57) ABSTRACT

A flash memory device and programming and erasing methods therewith is disclosed, to secure the programming and erasing characteristics by changing a structure of a floating gate, in which the flash memory device includes a first conductive type semiconductor substrate defined as a field area and an active area; a tunnel oxide layer on the active area of the first conductive type semiconductor substrate; a floating gate on the tunnel oxide layer, having at least first and second floating gates having different levels of energy band gap; a dielectric layer on the floating gate; a control gate on the dielectric layer; and second conductive type source/drain regions in the active area of the first conductive type semiconductor substrate at both sides of the floating gate.

6 Claims, 11 Drawing Sheets

_US 7,538,378 B2_

FLASH MEMORY DEVICE AND PROGRAMMING AND ERASING METHODS THEREWITH

CROSS-REFERENCE TO RELATED APPLICATIONS

This application claims the benefit of Korean Application Nos. P2003-101389 and P2003-101387, filed on Dec. 31, 2003, which is hereby incorporated by reference as if fully set forth herein.

BACKGROUND OF THE INVENTION

1. Field of the Invention

The present invention relates to a flash memory device and programming and erasing methods therewith, and more particularly, to a flash memory device and programming and erasing methods therewith, to secure the programming and erasing characteristics by changing a structure of a floating gate.

2. Discussion of the Related Art

Among semiconductor memory devices, a non-volatile memory device is an optimal device in that it is possible for a user to program data with easiness by switching a memory state in an electrical method, and also, it is possible to maintain the memory state of data even if a power is switched off.

On the fabrication process, the non-volatile memory device is largely classified into a floating gate type and an MIS (Metal-Insulator-Semiconductor) type, wherein the MIS type is formed of two or three dielectric layers.

The floating gate type non-volatile memory device realizes the memory characteristics by using a potential well. In detail, an ETOX (EPROM Tunnel Oxide) structure of EEPROM (Electrically Erasable & Programmable & Programmable Read Only Memory) is one of the most representative floating gate type non-volatile memory devices.

Meanwhile, the MIS type non-volatile memory device performs a memory function by using traps remaining in dielectric layer, bulk, dielectric layer-interface of dielectric layer, and dielectric layer-interface of semiconductor.

Programming and erasing methods of a floating gate type non-volatile memory device will be described with reference to the accompanying drawings.

FIG. 1 shows a cross sectional view of a memory device having an ETOX structure among floating gate type non-volatile memory devices according to the related art.

In a related art flash memory device, as shown in FIG. 1, a tunnel oxide layer 102, a floating gate 103, a dielectric layer 104 and a control gate 105 are sequentially deposited on a p-type semiconductor substrate 101. At this time, a source region S and a drain region D are formed in the surface of the p-type semiconductor substrate 101 at both sides of the deposited structure.

Programming and erasing methods of the floating gate type non-volatile memory device will be described as follows.

On the programming method, electrons are injected to a potential well formed in the floating gate, whereby a threshold voltage increases. On the erasing method, holes are injected to the potential well, whereby the holes are recombined with the electrons, thereby lowering the threshold voltage.

At this time, the electrons and the holes are generally injected in a hot electron injection method and a hot hole injection method. On erasing, in case of using an F-N (Fowler-Nordheim) tunneling instead of the hot hole injection method, it has the disadvantageous characteristics such as low erasing-speed. In this respect, the hot hole injection method is most generally used.

However, the related art programming and erasing methods have the following disadvantages.

On programming and erasing, the hot electron injection method and the hot hole injection method are generally used, whereby trap sites generate in the interface between the tunnel oxide layer and the semiconductor substrate, or the inside of the tunnel oxide layer, or the interface between the tunnel oxide layer and the floating gate. As a result, it is impossible to maintain the constant threshold voltage due to the trap sites. Also, the electrons or the holes stored in the floating gate are discharged through the trap sites.

SUMMARY OF THE INVENTION

Accordingly, the present invention is directed to a flash memory device and programming and erasing methods therewith that substantially obviates one or more problems due to limitations and disadvantages of the related art.

An object of the present invention is to provide a flash memory device and programming and erasing methods therewith, to secure the programming and erasing characteristics by changing a structure of a floating gate.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a flash memory device includes a first conductive type semiconductor substrate defined as a field area and an active area; a tunnel oxide layer on the active area of the first conductive type semiconductor substrate; a floating gate on the tunnel oxide layer, having at least first and second floating gates having different levels of energy band gap; a dielectric layer on the floating gate; a control gate on the dielectric layer; and second conductive type source/drain regions in the active area of the first conductive type semiconductor substrate at both sides of the floating gate.

In another aspect, a flash memory device includes a first conductive type semiconductor substrate defined as a field area and an active area; a tunnel oxide layer on the active area of the first conductive type semiconductor substrate; a first floating gate and a second floating gate for being in contact with each other in parallel, on the tunnel oxide layer; a dielectric layer on the first floating gate; a control gate on the dielectric layer; and second conductive type source/drain regions in the active area of the first conductive type semiconductor substrate at both sides of the first floating gate.

At this time, the dielectric layer is formed in a structure of oxide layer-nitride layer-oxide layer.

Also, the second floating gate has an energy band gap higher than that of the semiconductor substrate and lower than that of the dielectric layer.

In another aspect, a programming method of the flash memory device including a first floating gate and a second floating gate contacting with each other on a first conductive type semiconductor substrate; a control gate on the first floating gate; and second conductive type source/drain regions on the semiconductor substrate at both sides of the first floating gate, wherein the second floating gate has an energy band gap higher than that of the first floating gate, and has second conductive type impurity ions implanted thereto, includes steps of applying a positive (+) voltage to the control gate; applying a grounding voltage or a negative (−) voltage to the second floating gate; and floating the source/drain regions and the semiconductor substrate, whereby electrons generate in the second floating gate, and the generated electrons are transferred to and stored in the first floating gate.

In another aspect, an erasing method of the flash memory device including a first floating gate and a second floating gate contacting with each other on a first conductive type semiconductor substrate; a control gate on the first floating gate; and second conductive type source/drain regions on the semiconductor substrate at both sides of the first floating gate, wherein the second floating gate has an energy band gap higher than that of the first floating gate, and has second conductive type impurity ions implanted thereto, and the first floating gate has electrons stored therein, includes steps of injecting holes to the first floating gate to inducement for recombination of the holes with the electrons stored in the first floating gate, or discharging the electrons stored in the first floating gate to the semiconductor substrate by an F-N tunneling method.

In another aspect, a flash memory device includes a first conductive type semiconductor substrate defined as a field area and an active area; a tunnel oxide layer on the active area; a first floating gate and a second floating gate for being in contact with each other in parallel, on the tunnel oxide layer; a dielectric layer formed on the first floating gate and the second floating gate; a control gate on the dielectric layer; and second conductive type source/drain regions in the active area of the semiconductor substrate at both sides of the first floating gate/the second floating gate.

At this time, the first floating gate has a width corresponding to (or less than) a width of a depletion layer of the source/drain regions.

Also, the second floating gate has an energy band gap higher than that of the first floating gate and lower than that of the dielectric layer.

In another aspect, a programming method of the flash memory device including a first floating gate and a second floating gate contacting with each other in parallel, on a semiconductor substrate; a tunneling oxide between the first and second floating gates and the substrate; a control gate on the first and second floating gates; and second conductive type source/drain regions in the semiconductor substrate at both sides of the first and second floating gates, wherein the second floating gate has an energy band gap higher than that of the first floating gate, includes steps of applying a positive (+) voltage to the control gate and the drain region; and grounding the semiconductor substrate and the source region, whereby hot electrons generate in a depletion area of the drain region, the hot electrons are injected to the second floating gate by the tunnel oxide layer, and the electrons injected to the second floating gate are transferred to the first floating gate.

In another aspect, an erasing method of the flash memory device including a first floating gate and a second floating gate contacting with each other in parallel, on a semiconductor substrate; a tunneling oxide between the first and second floating gates and the substrate; a control gate on the first and second floating gates; and second conductive type source/drain regions in the semiconductor substrate at both sides of the first and second floating gates, wherein the second floating gate has an energy band gap higher than that of the first floating gate, and electrons are stored in the first floating gate, includes steps of respectively applying a negative (−) voltage and a positive (+) voltage to the control gate and the drain region; and grounding or floating the semiconductor substrate and the source region, whereby holes generate in a depletion area of the drain region, the holes are injected to the second floating gate by the tunnel oxide layer, and the holes injected to the second floating gate are transferred to the first floating gate, and are recombined with the stored electrons.

In another aspect, a flash memory device includes a first conductive type semiconductor substrate defined as a field area and an active area; a tunnel oxide layer on the active area of the first conductive type semiconductor substrate; a first floating gate and second/third floating gates for being in contact with each other, on the tunnel oxide layer, the second/third floating gates formed at both sides of the first floating gate; a dielectric layer on the first floating gate; a control gate on the dielectric layer; and second conductive type source/drain regions in the active area of the semiconductor substrate at both sides of the first floating gate.

At this time, the second and third floating gates are formed above the source/drain regions.

Also, the second and third floating gates have an energy band gap higher than that of the first floating gate and lower than that of the dielectric layer.

Also, second conductive type impurity ions are implanted to the second floating gate, and first conductive type impurity ions are implanted to the third floating gate.

In another aspect, a programming method of the flash memory device including a first floating gate and second/third floating gates contacting with each other in parallel, on a first conductive type semiconductor substrate, the second/third floating gates formed at both sides of the first floating gate; a control gate on the first floating gate; and second conductive type source/drain regions formed in the semiconductor substrate at both sides of the first floating gate, wherein the second and third floating gates have an energy band gap higher than that of the first floating gate, and second conductive type impurity ions are implanted to the second floating gate, and first conductive type impurity ions are implanted to the third floating gate, includes steps of applying a positive (+) voltage to the control gate; applying a grounding voltage or a negative (−) voltage to the second floating gate; and floating the source/drain regions and the semiconductor substrate, whereby electrons generate in the second floating gate, and the generated electrons are transferred to and stored in the first floating gate.

In another aspect, an erasing method of the flash memory device including a first floating gate and second/third floating gates contacting with each other in parallel, on a first conductive type semiconductor substrate, the second/third floating gates formed at both sides of the first floating gate; a control gate on the first floating gate; and second conductive type source/drain regions formed in the semiconductor substrate at both sides of the first floating gate, wherein the second and third floating gates have an energy band gap higher than that of the first floating gate, second conductive type impurity ions are implanted to the second floating gate, first conductive type impurity ions are implanted to the third floating gate, and electrons are stored in the first floating gate, includes steps of applying a grounding voltage or a negative (−) voltage to the control gate; applying a positive (+) voltage to the third floating gate; and floating the source/drain regions, the semiconductor substrate and the second floating gate, whereby holes generate in the third floating gate, and the generated holes are transferred to the first floating gate, and the electrons are recombined with the electrons stored in the first floating gate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a flash memory device and programming and erasing methods therewith according to the present invention will be described with reference to the accompanying drawings.

FIRST EMBODIMENT

Figure 1:
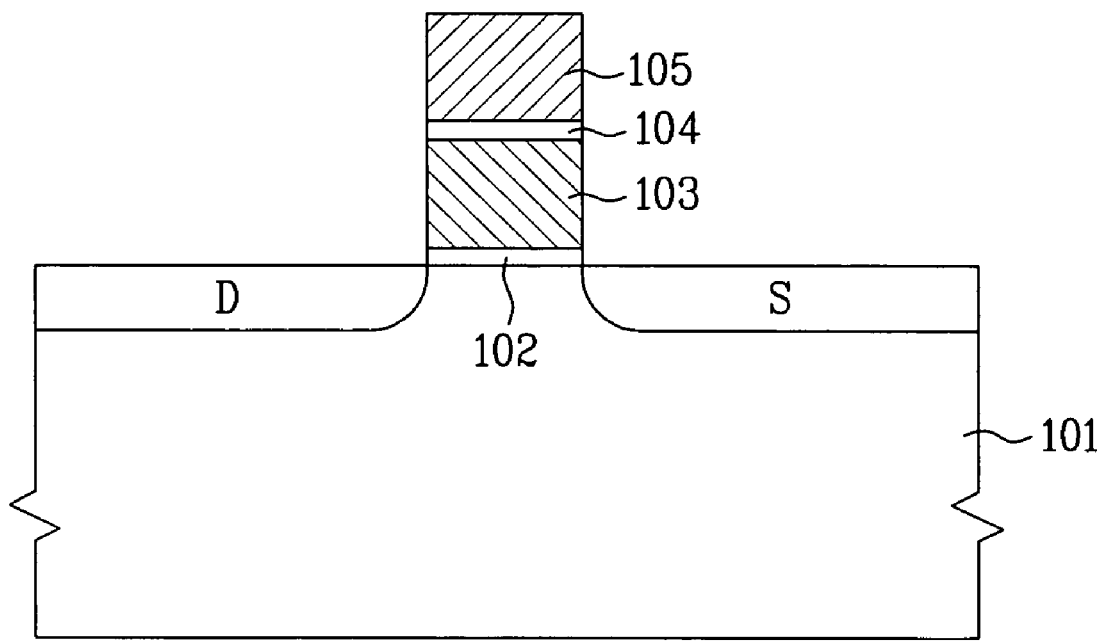
FIG. 1 shows a cross sectional view of a memory device having an ETOX structure among floating gate type non-volatile memory devices according to the related art.
Figure 2:
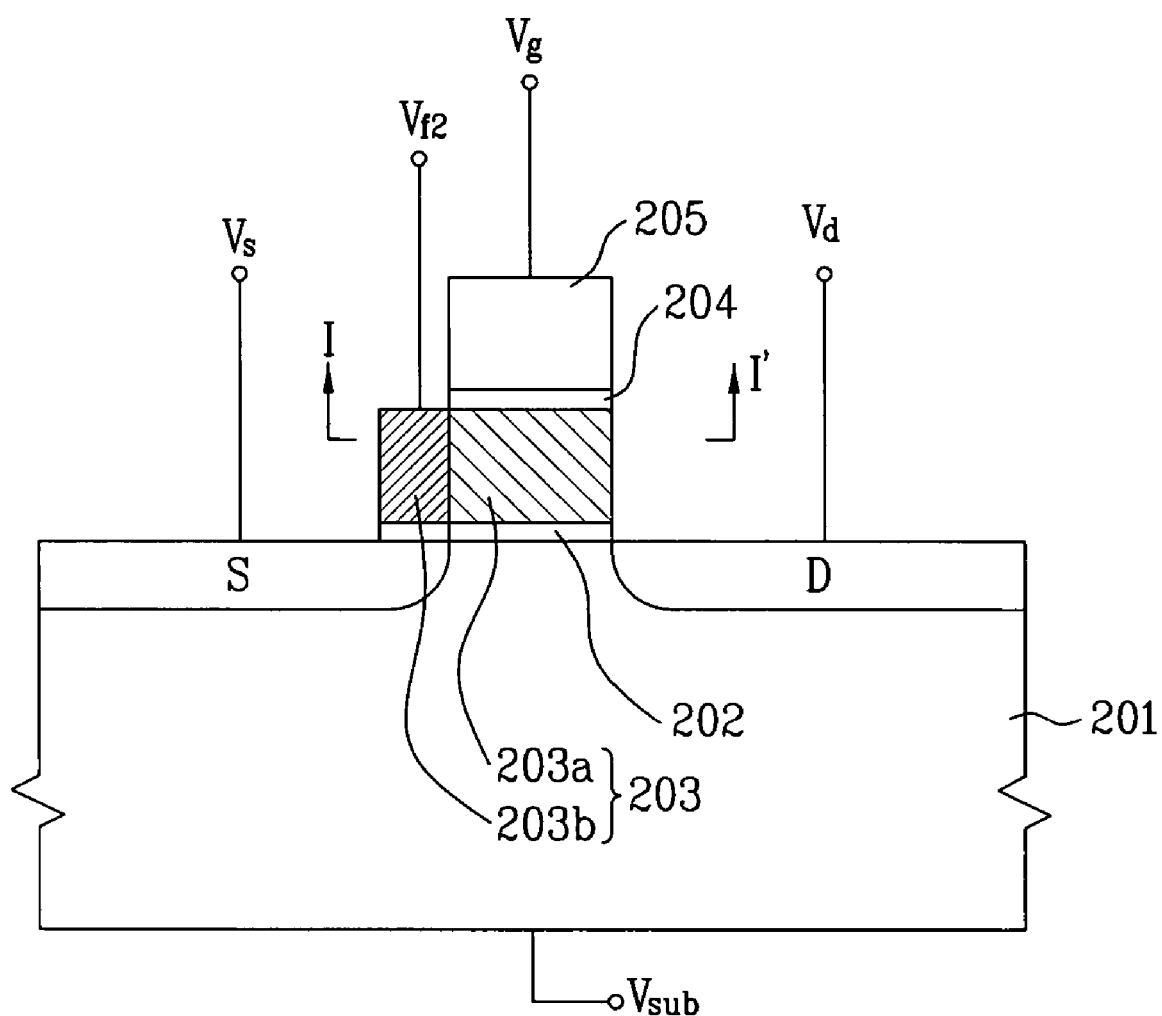
FIG. 2 shows a cross sectional view of a flash memory device according to the first embodiment of the present invention.

FIG. 2 shows a cross sectional view of a flash memory device according to the first embodiment of the present invention. In the flash memory device according to the first embodiment of the present invention, as shown in FIG. 2, a semiconductor substrate 201 is defined as a field area and an active area, and a device isolation layer (not shown) is formed in the field area.

In the active area of the semiconductor substrate 201, there are a tunnel oxide layer 202, a floating gate 203, a dielectric layer 204, and a control gate 205 formed in sequence. At this time, the semiconductor substrate 201 may be formed of n-type or p-type, wherein the p-type semiconductor substrate will be described for convenience of explanation. Although not shown, a passivation layer is deposited on an entire surface of the semiconductor substrate 201 including the control gate 205.

The dielectric layer 204 may be formed in a structure of oxide layer-nitride layer-oxide layer. Also, the floating gate 203 and the control gate 205 may be formed of polysilicon to which n-type impurity ions are implanted. The floating gate 203 is comprised of a first floating gate 203a and a second floating gate 203b, wherein a width of the first floating gate 203a corresponds to a width of the control gate 205.

Then, n-type impurity ions are implanted into the semiconductor substrate 201 at both sides of the first floating gate 203a/the control gate 205, thereby forming a source region S and a drain region D. The second floating gate 203b is in contact with the first floating gate 203a, and the second floating gate 203b is formed on the tunnel oxide layer 202 for being overlapped with the source region S or the drain region D. That is, the tunnel oxide layer 202 extends to the source region S or the drain region D at a predetermined degree. At this time, a width of the second floating gate 203b is not limited. For example, the second floating gate 203b is formed at a predetermined minimum width to apply a bias-voltage thereto, and not to have effects on spacers and silicide formed in the source region S or the drain region D.

Also, the first floating gate 203a is formed of polysilicon. The second floating gate 203b is formed of a material having an energy band (Eg) higher than that of silicon Si (Eg-1.1 eV) of the semiconductor substrate 201 or the first floating gate 203a, and lower than that of oxide layer $SiO_2$ of the dielectric layer 204 being in contact with the first floating gate 203a. For example, the second floating gate 203b may be formed of any one of chemical compound semiconductors of Sic, Alp, AlSb, GaP, GaAs, InP, ZnS, ZnSe, ZnTe, CdS, CdSe and CdTe, or any one of oxides of $Al_2O_3$, $Y_2O_3$, $HfO_2$, $ZrO_2$, $BaZrO_2$, $BaTiO_3$, $Ta_2O_5$, CaO, SrO, BaO, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Db_2O_3$, $Dy_2O_3$, $Ho_2O_3$, $Er_2O_3$, $Tm_2O_3$, $Yb_2O_3$ and $Lu_2O_3$. Also, the second floating gate 203b is doped with impurity ions having the opposite conductive type to that of the semiconductor substrate 201. For example, in case the semiconductor substrate 201 is in p-type, n-type impurity ions are implanted to the second floating gate 203b. Meanwhile, in case the semiconductor substrate 201 is in n-type, p-type impurity ions are implanted to the second floating gate 203b.

A programming method using the flash memory device according the first embodiment of the present invention will be described as follows.

Figure 3:
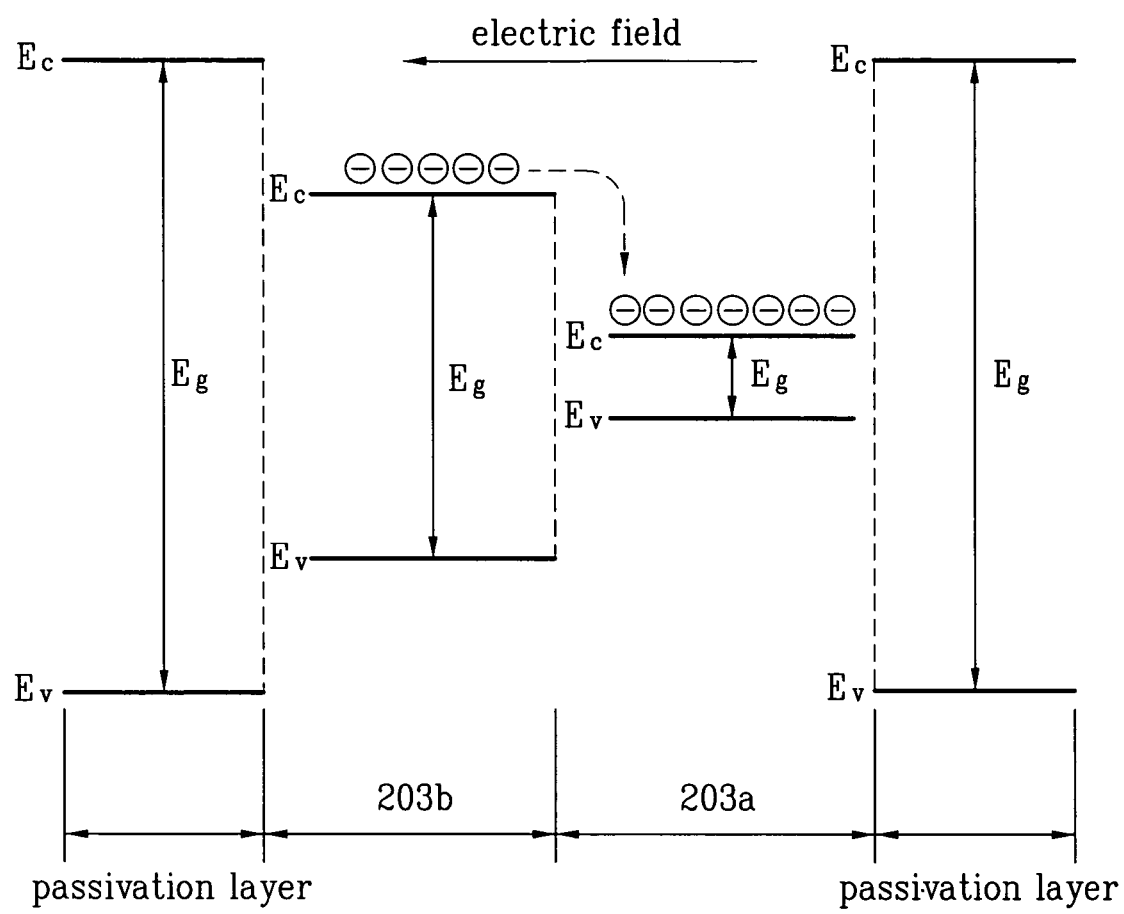
FIG. 3 shows an exemplary view of explaining energy band and transfer of electrons in a passivation layer/a second floating gate/a first floating gate/a passivation layer along I-I' of FIG. 2.

FIG. 3 shows an exemplary view of explaining energy band and transfer of electrons in the passivation layer/the second floating gate/the first floating gate/the passivation layer along I-I' of FIG. 2.

In order to program data, first, a positive (+) voltage is applied to the control gate (Vg) 205, and a ground voltage or a negative (−) voltage is applied to the second floating gate (Vf2) 203b. In this state, the source region (Vs) S, the drain region (Vd) D and the semiconductor substrate (Vsub) 201 are floated together. At this time, it is preferable to provide the voltage applied to the control gate 205 and the second floating gate 203b in the conditions of generating a great amount of direct electron injections.

When the voltage is applied in this conditions, electrons generate due to the bias-voltage applied to the second floating gate 203b since the second floating gate 203b is doped with the n-type impurity ions. Then, the generated electrons are transferred to a conduction band (Ec) of the first floating gate 203a having a stable energy potential. At this time, an electric field applied to the control gate 205 extends to the second floating gate 203b by the first floating gate 203a, so that electrons injected from the second floating gate 203b are stored in a potential well of the first floating gate 203a.

The process of transferring the electrons generated in the second floating gate 203b to the first floating gate 203a will be explained as follows.

First, the energy band gap (Eg) means the energy required for transferring the electrons from a valence band (Ev) to the conduction band (Ec). As shown in FIG. 3, the level of the energy band gap (Eg) is in order of the first floating gate 203a, the second floating gate 203b, and the passivation layer. That is, the energy band gap (Eg) of the first floating gate 203a is high, and the energy band gap (Eg) of the passivation layer is low.

The second floating gate 203b is formed of the material having the energy band gap (Eg) higher than that of the silicon Si (Eg-1.1 eV) and lower than that of the silicon oxide layer $SiO_2$, and the second floating gate 203b is in contact with the first floating ate 203a of the polysilicon material. As a result, the electrons of the conduction band of the second floating gate 203b are transferred to the conduction band of the first floating gate 203a which is more stable. In this state, the electrons, transferred to the conduction band of the first floating gate 203a by the electric field, are stably stored in the potential well of the first floating gate 203a, whereby a threshold voltage increases. Accordingly, the programming method of the flash memory device according to the first embodiment of the present invention is completed.

As described above, in the first embodiment of the present invention, the floating gate is formed of the two materials (the first floating gate 203a and the second floating gate 203b) having the different levels of the energy band gap. Also, the second floating gate 203b is formed of the semiconductor having the n-type impurity ions implanted thereto, and the energy band gap of the second floating gate 203b is higher than the energy band gap of the first floating gate 203a. Accordingly, the electrons generate from the second floating gate 203b by the bias-voltage applied to the second floating gate 203b, and the generated electrons are transferred to the first floating gate 203a. Then, the electrons transferred to the first floating gate 203a are stably stored in the first floating gate 203a as long as any voltage is not applied from the external. As a result, the applied threshold voltage is maintained stably.

In the related art of injecting the electrons to the floating gate by the tunnel oxide layer, trap site generates in the interface and the inside of the tunnel oxide layer. However, the present invention has no problem of the trap site.

Meanwhile, like the related art erasing method, an erasing method of the flash memory device according to the first embodiment of the present invention uses a hot hole injection method. That is, holes are injected to the potential of the first floating gate 203a, so that it is possible to induce the recombination of holes with the electrons stored in the first floating gate 203a, thereby decreasing the threshold voltage. In addition to the hot hole injection method, the electrons stored in the first floating gate 203a may be discharged to the semiconductor substrate in an F-N tunneling method, so as to decrease the threshold voltage.

SECOND EMBODIMENT

Figure 4:
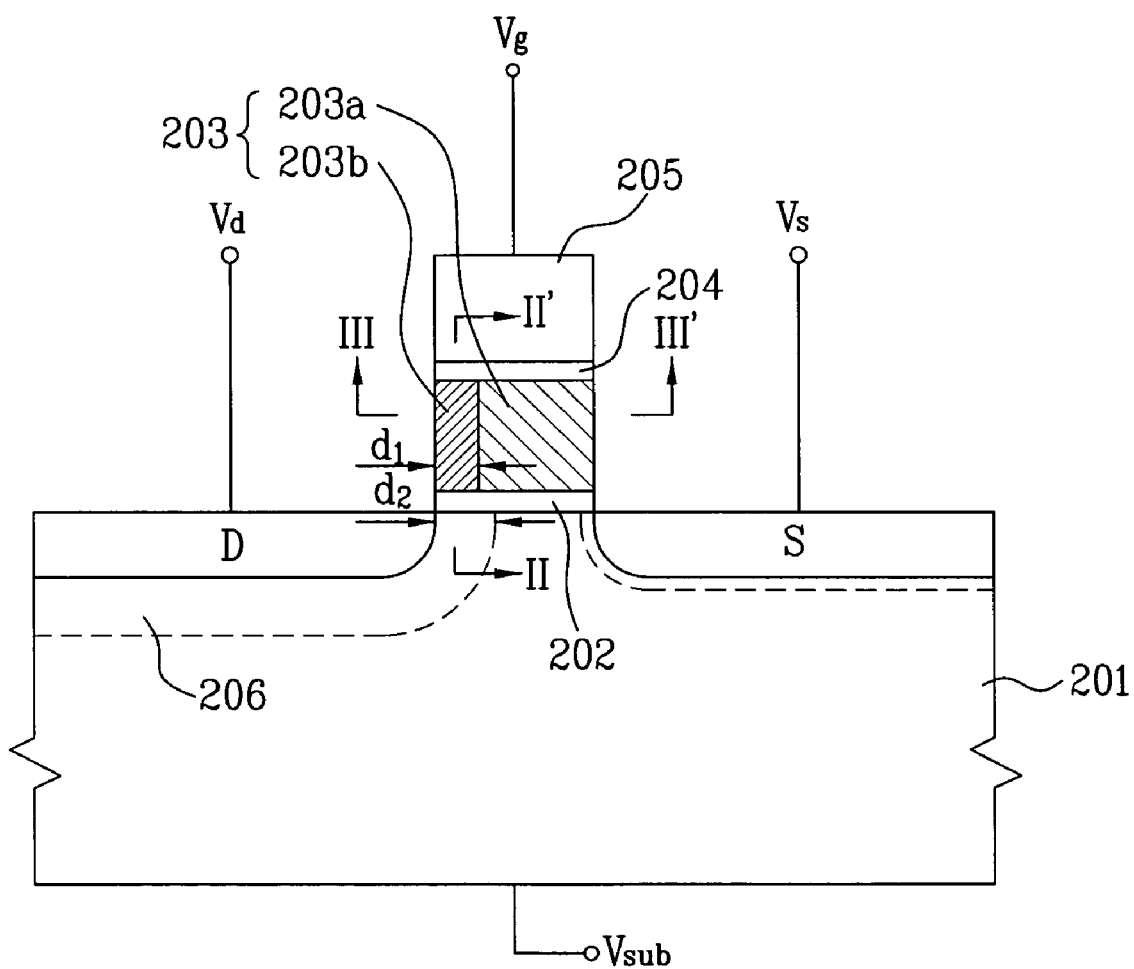
FIG. 4 shows a cross sectional view of a flash memory device according to the second embodiment of the present invention.

A flash memory device according to the second embodiment of the present invention will be described as follows. FIG. 4 shows a cross sectional view of a flash memory device according to the second embodiment of the present invention.

In the flash memory device according to the second embodiment of the present invention, as shown in FIG. 4, a semiconductor substrate 201 is defined as a field area and an active area, and a device isolation layer (not shown) is formed in the field area. At this time, the semiconductor substrate 201 may be formed of n-type or p-type, wherein the p-type semiconductor substrate will be described for convenience of explanation.

In the active area of the semiconductor substrate 201, there are a tunnel oxide layer 202, a floating gate 203, a dielectric layer 204, and a control gate 205 formed in sequence. Then, n-type impurity ions are implanted into the semiconductor substrate 201 at both sides of the first floating gate 203/the control gate 205, thereby forming a source region S and a drain region D. Also, although not shown, a passivation layer is formed on an entire surface of the semiconductor substrate 201 including the control gate 205.

The dielectric layer 204 may be formed in a structure of oxide layer-nitride layer-oxide layer. The control gate 205 may be formed of polysilicon having n-type impurity ions implanted thereto. Also, the floating gate 203 is comprised of a first floating gate 203a and a second floating gate 203b. Herein, a width 'd1' of the second floating gate 203b is corresponding to (or less than) a width 'd2' of a depletion area 206 extended from the drain region D. Preferably, the width 'd1' of the second floating gate 203 is determined at a degree between 400 Å and 600 Å. Also, the first floating gate 203a is formed of polysilicon. The second floating gate 203b is formed of a material having an energy band gap (Eg) higher than that of silicon Si (Eg-1.1 eV) of the semiconductor substrate 201 or the first floating gate 203a, and lower than that of oxide layer $SiO_2$ of the dielectric layer 204 being in contact with the first floating gate 203a. The second floating gate 203b is formed of the same material as that according to the first embodiment of the present invention.

Programming and erasing methods using the flash memory device according to the second embodiment of the present invention will be described as follows.

Figure 5:
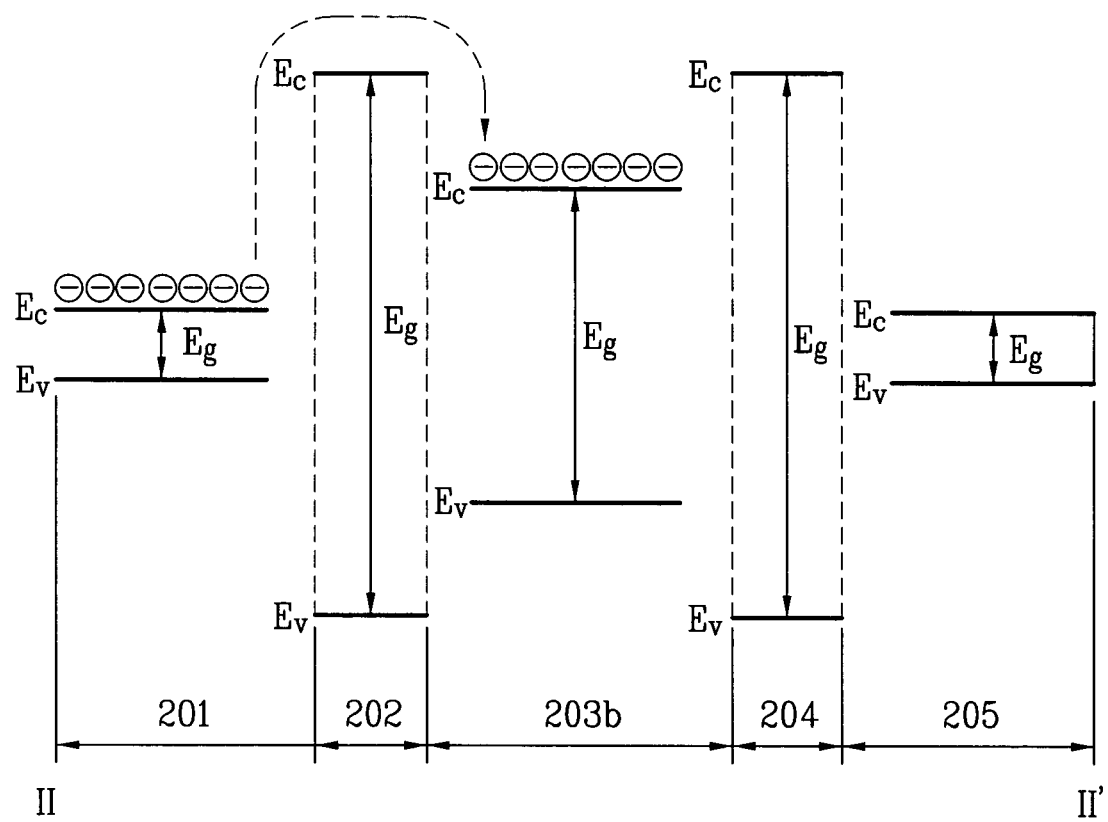
FIG. 5 shows an exemplary view of explaining energy band and transfer of electrons in a semiconductor substrate/a tunnel oxide layer/a second floating gate/a dielectric layer/a control gate along II-II' of FIG. 4.
Figure 6:
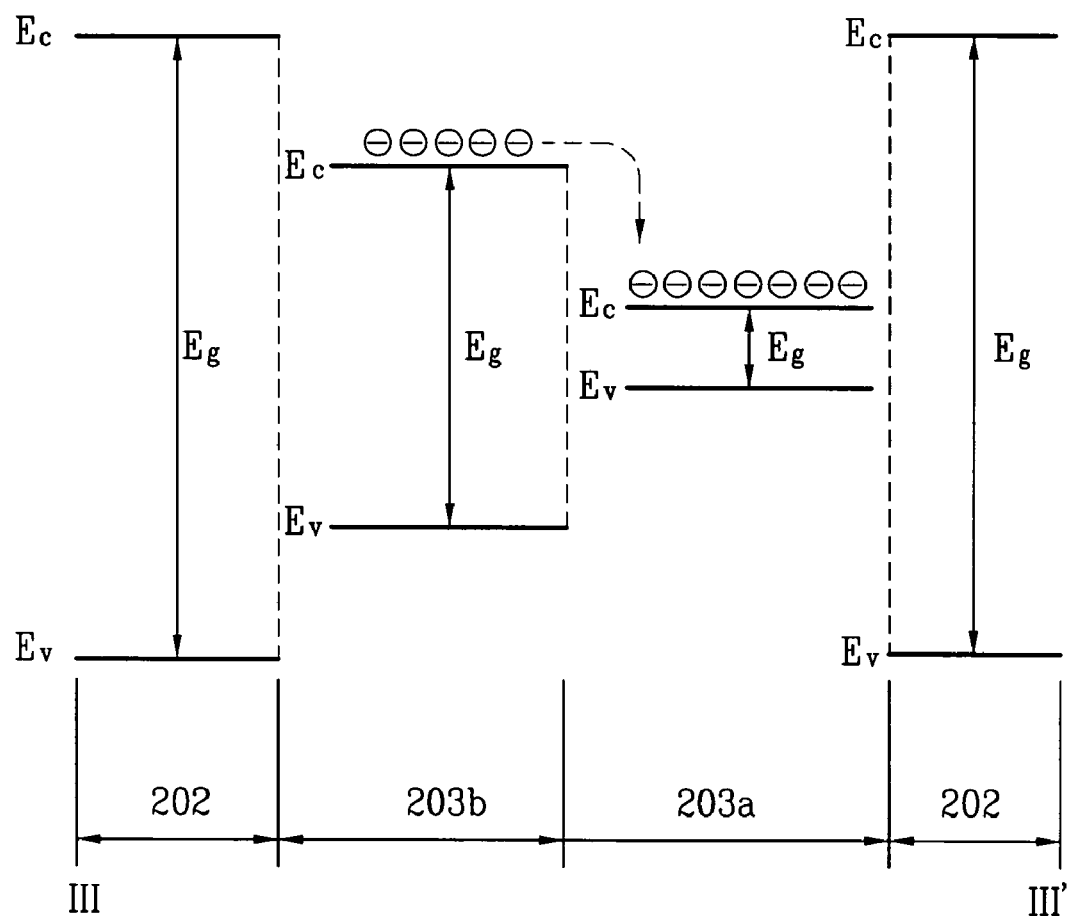
FIG. 6 shows an exemplary view of explaining energy band and transfer of electrons in a passivation layer/a second floating gate/a first floating gate/a passivation layer along II-II' of FIG. 4.

FIG. 5 shows an exemplary view of explaining energy band and transfer of electrons in the semiconductor substrate/the tunnel oxide layer/the second floating gate/the dielectric layer/the control gate along II-II' of FIG. 4. FIG. 6 shows an exemplary view of explaining energy band and transfer of electrons in the passivation layer/the second floating gate/the first floating gate/the passivation layer along II-II' of FIG. 4.

In order to program data, first, predetermined positive (+) voltages (Vg, Vd) are respectively applied to the control gate 205 and the drain region D, and the source region (Vs) S and the semiconductor substrate (Vsub) 201 are grounded. At this time, preferably, the voltages (Vg, Vd) applied to the control gate 205 and the drain region D have the optimal conditions of generating a great amount of hot electron injections.

On applying bias, electrons of the source region S are transferred to a channel region below the tunnel oxide layer 202. Then, the electrons are accelerated by an electric field applied in horizontal, whereby hot electrons generate around the drain region D. After that, when the hot electrons are transferred toward the tunnel oxide layer 202 by a vertical electric field formed by the positive (+) voltage applied to the control gate 205, the hot electrons get over an energy barrier between the semiconductor substrate 201 and the tunnel oxide layer 202. Thereafter, the hot electrons are injected to a conduction band (Ec) of the second floating gate 203b.

The process of transferring the electrons from the channel region of the semiconductor substrate 201 to the second floating gate 203b will be described with reference to FIG. 5. Referring to FIG. 5, in state material layers are formed in order of the semiconductor substrate/the tunnel oxide layer/the second floating gate/the dielectric layer/the control gate, the energy required for being transferred to the energy band gap (Eg) to each material layer is shown.

As shown in FIG. 5, the level of energy band gap (Eg) is in order of conductor, semiconductor and insulator, wherein the energy band gap (Eg) of the conductor is high, and the energy band gap (Eg) of the insulator is low. To transfer the electrons remaining in the channel region of the semiconductor substrate 201 to the conduction band of the second floating gate 203b, there is requirement for applying the energy of getting over the energy band gap of the tunnel oxide layer 202. This energy is obtained when the electrons are accelerated with the voltage applied to the drain region D. In this process, the electrons remaining in the channel region of the semiconductor substrate 201 get over the tunnel oxide layer 202, and then the electrons are transferred to the conduction band of the second floating gate 203b.

As described above, the second floating gate 203b is formed of the material having the energy band gap (Eg) higher than that of the silicon Si and lower than that of the silicon oxide $SiO_2$, and the second floating gate 203b is in contact with the first floating gate 203a of the polysilicon material. As a result, the electrons remaining in the conduction band of the second floating gate 203b are transferred to the conduction band of the first floating gate 203a which is more stable.

The process of transferring the electrons of the second floating gate 203b to the first floating gate 203a will be described with reference to FIG. 6. That is, in the structure of the passivation layer/the second floating gate/the first floating gate/the passivation layer, the electrons remaining the conduction band (Ec) of the second floating gate 203b are transferred to the conduction band (Ec) of the first floating gate 203a, wherein the energy band gap in the conduction band of the first floating gate 203a is lower than the energy band gap in the conduction band of the second floating gate 203b. Thereafter, the electrons injected to the second floating gate 203b by the tunnel oxide layer 202 are transferred to a potential well of the first floating gate 203a. Accordingly, the programming method of the flash memory device according to the second embodiment of the present invention is completed.

In the programming method of the flash memory device according to the second embodiment of the present invention, the electrons transferred from the source region S are changed to the hot electrons in the channel region adjacent to the drain region D. Thereafter, the hot electrons get over the potential barrier of the tunnel oxide layer 202, and then are transferred to the floating gate. In this respect, this process of the programming method according to the second embodiment of the present invention is very similar to the related art process of the programming method. However, in the programming method of the flash memory device according to the second embodiment of the present invention, the floating gate is comprised of the two materials (the first floating gate 203a and the second floating gate 203b) having the different levels of the energy band gap. Also, the energy band gap of the second floating gate 203b is higher than the energy band gap of the first floating gate 203a, whereby the electrons injected to the second floating gate 203b are spontaneously transferred to the first floating gate 203a. Accordingly, like the related art, trap sites generate in the interface and the inside of the tunnel oxide layer 202 below the second floating gate 203b having the electrons injected thereto. However, the electrons injected to the second floating gate 203b are transferred to the first floating gate 203a having the lower energy band gap, whereby the electrons injected by the trap sites are not discharged. To discharge the electrons stored in the first floating gate 203a to the semiconductor substrate, it is necessary to pass by the second floating gate 203b having the higher energy band gap than that of the first floating gate 203a. That is, as long as the voltage is not applied to the first floating gate 203a from the external, the electrons are stored in the first floating gate 203a, thereby maintaining the applied threshold voltage stably.

An erasing method of the flash memory device according to the second embodiment of the present invention will be described as follows, which is progressed in the similar process to that of the programming method.

Figure 7:
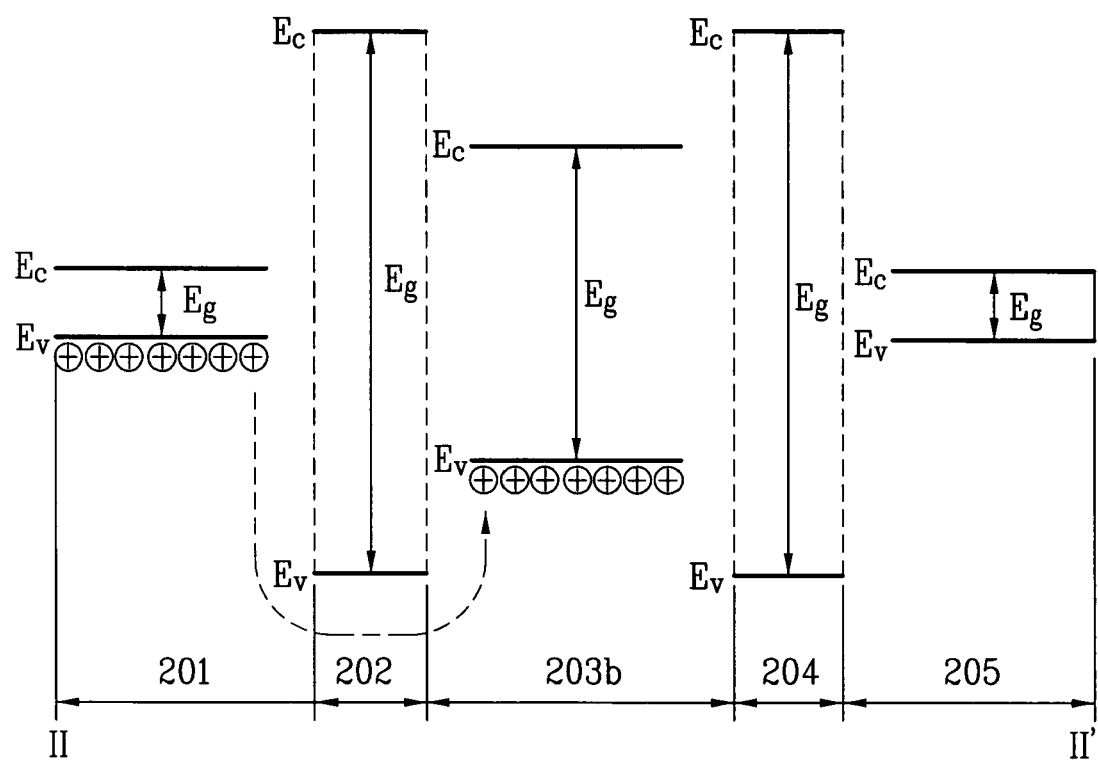
FIG. 7 shows an exemplary view of explaining energy band and transfer of holes in a semiconductor substrate/a tunnel oxide layer/a second floating gate/a dielectric layer/a control gate along II-II' of FIG. 4.
Figure 8:
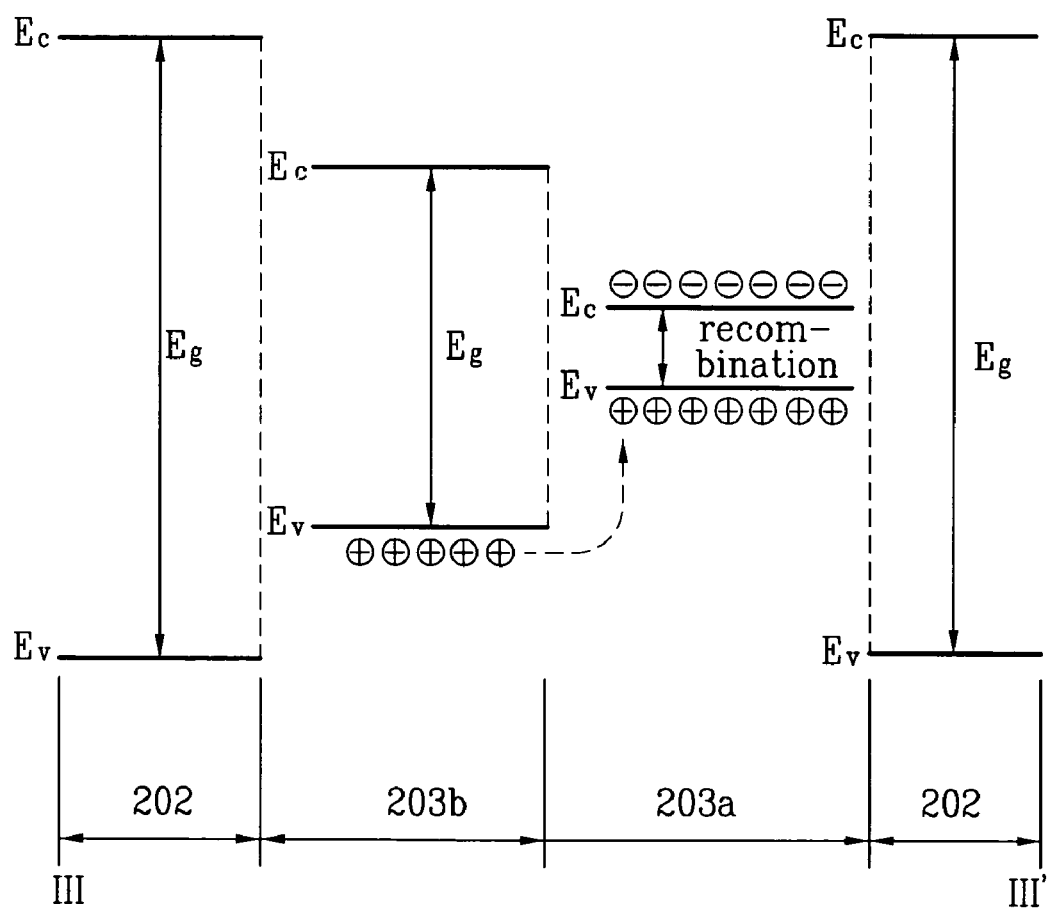
FIG. 8 shows an exemplary view of explaining energy band and transfer of holes in a passivation layer/a second floating gate/a first floating gate/a passivation layer along II-II' of FIG. 4.

FIG. 7 shows an exemplary view of explaining energy band and transfer of holes in the semiconductor substrate/the tunnel oxide layer/the second floating gate/the dielectric layer/the control gate along II-II' of FIG. 4. FIG. 8 shows an exemplary view of explaining energy band and transfer of holes in the passivation layer/the second floating gate/the first floating gate/the passivation layer along II-II' of FIG. 4.

To erase the programmed data, a negative (−) voltage is applied to the control gate (Vg) 205, and a positive (+) voltage is applied to the drain region (Vd) D. Also, the source region (Vs) S and the semiconductor substrate (Vsub) 201 are simultaneously grounded or floated. At this time, it is preferable to provide the voltages applied to the control gate 205 and the drain region D in the conditions of generating a great amount of hot hole injections.

When the voltages are applied in this conditions, holes generated in the depletion area 206 of the drain region D, as shown in FIG. 7, are injected to a valence band of the second floating gate 203b by the tunnel oxide layer 202. Then, as shown in FIG. 8, the holes injected to the valence band of the second floating gate 203b are transferred to the valence band of the first floating gate 203a, wherein the energy band gap in the valence band of the first floating gate is lower than the energy band gap in the valence band of the second floating gate. The holes transferred to the valence band of the first floating gate 203a are recombined with the electrons injected to the conduction band of the first floating gate 203a, whereby the threshold voltage lowers. Accordingly, the electrons stored in the first floating gate 203a are removed, so that the flash memory device is maintained in the erasing state.

In the same way as the programming method, the erasing method also has the holes injected by the second floating gate 203b, wherein the injected holes are transferred to the first floating gate 203a having the more stable energy level.

Accordingly, it is possible to prevent the problems generated by the trap sites formed in the interface and the inside of the tunnel oxide layer 202 below the second floating gate 203b.

THIRD EMBODIMENT

Figure 9:
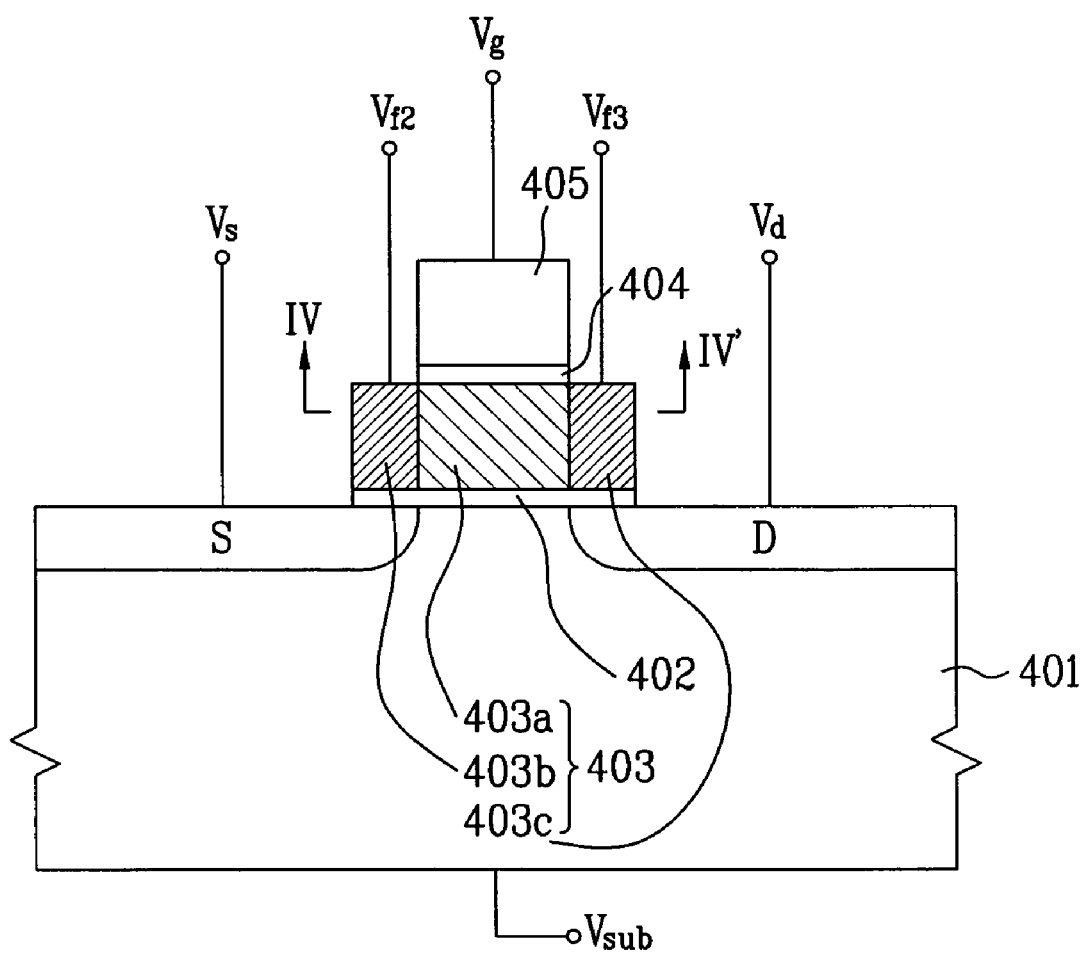
FIG. 9 shows a cross sectional view of a flash memory device according to the third embodiment of the present invention.

A flash memory device according to the third embodiment of the present invention will be described with reference to FIG. 9. FIG. 9 shows a cross sectional view of a flash memory device according to the third embodiment of the present invention. In the flash memory device according to the third embodiment of the present invention, as shown in FIG. 9, a tunnel oxide layer 402, a floating gate 403, a dielectric layer 404 and a control gate 405 are sequentially deposited in an active area of a p-type semiconductor substrate 401 defined by a device isolation layer (not shown).

The floating gate 403 is comprised of a first floating gate 403a, a second floating gate 403b and a third floating gate 403c, wherein the first floating gate 403a is positioned in the center between the second floating gate 403b and the third floating gate 403c. At this time, the first floating gate 403a is formed at a width corresponding to that of the control gate 405.

Then, n-type impurity ions are implanted to the semiconductor substrate 401 at both sides of the first floating gate 403a/the control gate 405, thereby forming a source region S and a drain region D. Accordingly, the second floating gate 403b and the third floating gate 403c, being in contact with the first floating gate 403a, are formed on the tunnel oxide layer 402 of the source region S or the drain region D. The tunnel oxide layer 402 is extended toward the source region S and the drain region D at a predetermined degree. Also, although not shown, a passivation layer is formed on an entire surface of the semiconductor substrate 401 including the control gate 405.

The dielectric layer 404 may be formed in a structure of oxide layer-nitride layer-oxide layer. Also, the control gate 405 may be formed of polysilicon to which n-type impurity ions are implanted. At this time, the width in each of the second and third floating gates 403b and 403c is not limited, which is formed at a predetermined minimum width to apply a bias-voltage thereto, and not to have effects on spacers and silicide formed in the source region S or the drain region D.

Also, the first floating gate 403a is formed of polysilicon. The second floating gate 403b and the third floating gate 403c are formed of a material having an energy band (Eg) higher than that of silicon Si (Eg-1.1 eV) of the semiconductor substrate 401 or the first floating gate 203a, and lower than that of oxide layer $SiO_2$ of the dielectric layer 404 being in contact with the first floating gate 403a. In detail, the second floating gate 403b and the third floating gate 403c may be formed of the same material as that explained in the first embodiment of the present invention. Then, impurity ions having different conductive types are implanted to the respective second and third floating gates 403b and 403c. For example, n-type impurity ions are implanted to the second floating gate 403b, and p-type impurity ions are implanted to the third floating gate 403c.

Programming and erasing methods using the flash memory device according to the third embodiment of the present invention will be described as follows.

Figure 10:
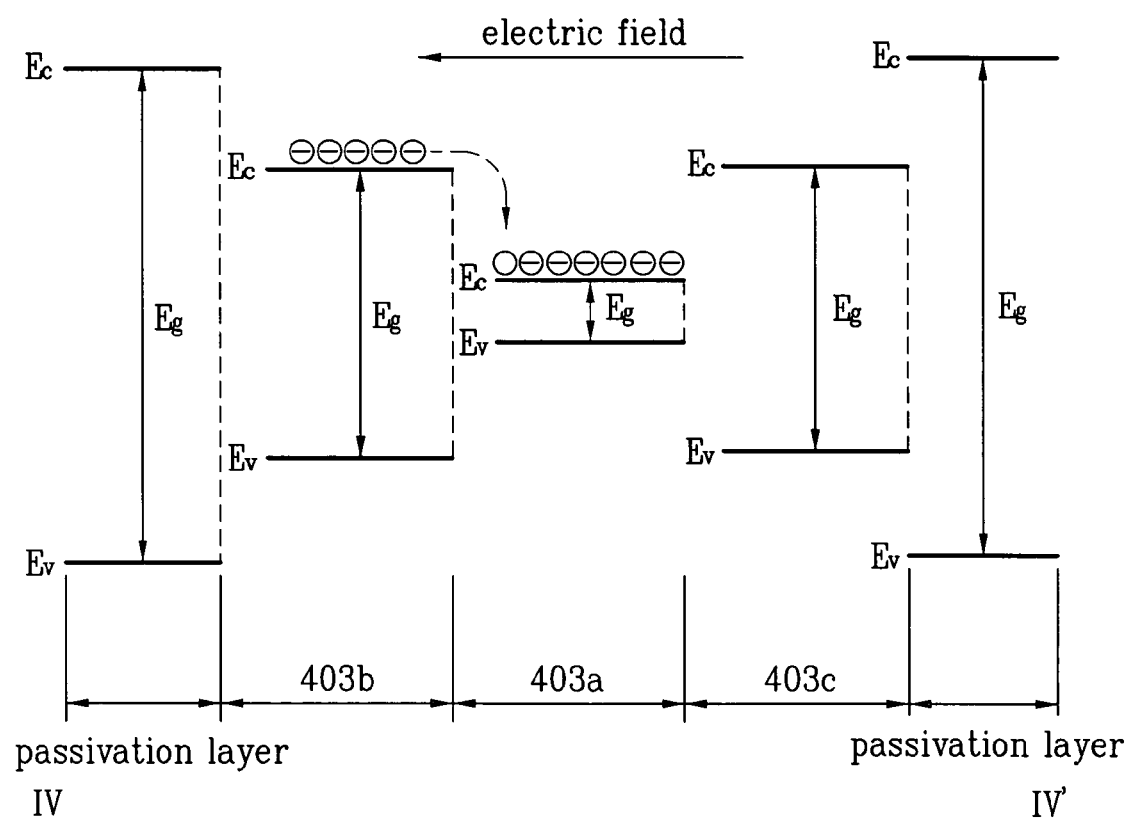
FIG. 10 shows an exemplary view of explaining energy band and transfer of electrons in a passivation layer/a second floating gate/a first floating gate/a third floating gate/a passivation layer along III-III' of FIG. 9.
Figure 11:
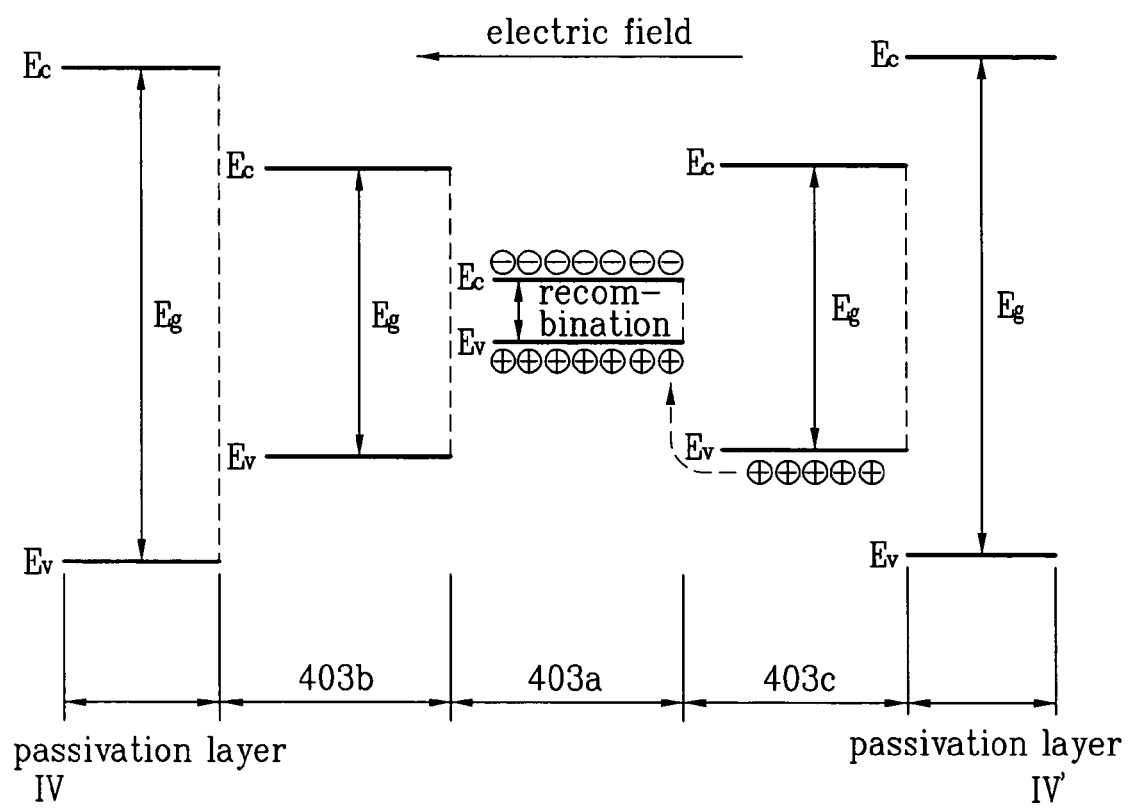
FIG. 11 shows an exemplary view of explaining energy band and transfer of holes in a passivation layer/a second floating gate/a first floating gate/a third floating gate/a passivation layer along III-III' of FIG. 9.

FIG. 10 shows an exemplary view of explaining energy band and transfer of electrons in the passivation layer/the second floating gate/the first floating gate/the third floating gate/the passivation layer along III-III' of FIG. 9. FIG. 11 shows an exemplary view of explaining energy band and transfer of holes in the passivation layer/the second floating gate/the first floating gate/the third floating gate/the passivation layer along III-III' of FIG. 9.

The programming method using the flash memory device according to the third embodiment of the present invention is very similar to the programming method using the flash memory device according to the first embodiment of the present invention. First, a positive (+) voltage (Vg) is applied to the control gate 405, and a ground voltage or a negative (−) voltage is applied to the second floating gate (Vf2) 403b. Simultaneously, the source region (Vs) S, the drain region (Vd) D, the semiconductor substrate (Vsub) 401 and the third floating gate (Vf3) 403c are floated together.

When the voltage is applied in this conditions, electrons generate due to the bias-voltage applied to the second floating gate 403b since the second floating gate 403b is doped with the n-type impurity ions. Then, as shown in FIG. 10, the electrons are transferred to a conduction band (Ec) of the first floating gate 403a having a more stable energy potential that that of the second floating gate 403b. At this time, an electric field applied to the control gate 405 extends to the second floating gate 403b by the first floating gate 403a, so that electrons injected from the second floating gate 403b are stored in a potential well of the first floating gate 403a, thereby increasing a threshold voltage.

The erasing method using the flash memory device according to the third embodiment of the present invention will be described with reference to FIG. 11. First, to erase the programmed data, a ground voltage or a negative (−) voltage is applied to the control gate 405, and a positive (+) voltage is applied to the third floating gate 403c. Simultaneously, the source region S/the drain region D, the semiconductor substrate 401 and the second floating gate 403b are floated together. At this time, it is preferable to provide the voltages applied to the control gate 405 and the third floating gate 403c in the conditions of generating a great amount of direct injections.

When the voltages are applied in this conditions, holes generate due to the voltage applied to the third floating gate 403c since the p-type impurity ions are doped to the third floating gate 403c. Then, as shown in FIG. 11, the generated holes are transferred to a valence band (Ev) of the first floating gate 403a having the more stable energy potential than that of the third floating gate 403c. At this time, as the electric field applied to the control gate 405 extends to the third floating gate 403c by the first floating gate 403a, the holes injected from the third floating gate 403c are transferred to the valence band (Ev) of the first floating gate 403a.

After that, the holes transferred to the valence band (Ev) of the first floating gate 403a are recombined with the electrons injected to the conduction band (Ec) of the first floating gate 403a according to the program, whereby the threshold voltage lowers. Accordingly, the electrons transferred from the second floating gate 403b to the first floating gate 403a are removed, so that the flash memory device is maintained in the erasing state.

As mentioned above, the flash memory device and the programming and erasing methods using the same have the following advantages.

In the flash memory device according to the present invention, the floating gate may be formed of the first floating gate/the second floating gate, or the first floating gate/the second floating gate/the third floating gate. Herein, the energy band gap of the first floating gate is lower than the energy band gap of the second floating gate/the third floating gate. Also, the impurity ions are previously implanted to the second floating gate and the third floating gate. In this state, the voltages are applied to the second floating gate and the third floating gate, whereby the electrons or the holes generate, and the generated electrons or holes are transferred to the first floating gate having the more stable energy potential. As a result, unlike the related art having the problem of the tunnel oxide layer damaged by the hot electron injection or the hot hole injection, the programming and erasing methods of the flash memory device according to the present invention prevent the damage of the tunnel oxide layer. Accordingly, it is possible to overcome the problem of leakage current generated by the trap site, thereby maintaining the stable threshold voltage on programming and erasing.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A flash memory device comprising:
    a first conductive type semiconductor substrate defined as a field area and an active area;
    a tunnel oxide layer on the active area of the first conductive type semiconductor substrate;
    a first floating gate formed on the tunnel oxide layer;
    a second floating gate formed on the tunnel oxide layer, wherein a lateral sidewall of the second floating gate is in contact with a lateral sidewall of the first floating gate;
    a dielectric layer on the first floating gate;
    a control gate on the dielectric layer; and
    second conductive type source/drain regions in the active area of the first conductive type semiconductor substrate at both sides of the first floating gate.

2. The flash memory device of claim 1, wherein the dielectric layer is formed in a structure of oxide layer-nitride layer-oxide layer.

3. The flash memory device of claim 1, wherein the first floating gate and the control gate are formed of polysilicon having second conductive type impurity ions implanted thereto.

4. The flash memory device of claim 1, wherein the first floating gate has the same width as the control gate.

5. The flash memory device of claim 1, wherein the second floating gate is formed above the source/drain regions.

6. The flash memory device of claim 1, wherein the second floating gate has an energy band gap higher than that of the first conductive type semiconductor substrate and lower than that of the dielectric layer.

* * * * *